United States Patent
Bathan et al.

(10) Patent No.: US 8,802,555 B2
(45) Date of Patent: Aug. 12, 2014

(54) INTEGRATED CIRCUIT PACKAGING SYSTEM WITH INTERCONNECTS AND METHOD OF MANUFACTURE THEREOF

(75) Inventors: Henry Descalzo Bathan, Singapore (SG); Zigmund Ramirez Camacho, Singapore (SG); Jairus Legaspi Pisigan, Singapore (SG); Rachel Layda Abinan, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 0 days.

(21) Appl. No.: 13/069,980

(22) Filed: Mar. 23, 2011

(65) Prior Publication Data

US 2012/0241931 A1  Sep. 27, 2012

(51) Int. Cl.
*H01L 21/44* (2006.01)

(52) U.S. Cl.
USPC ............................................. 438/613

(58) Field of Classification Search
CPC ....................................... H05K 3/326
USPC ........................................ 438/109
See application file for complete search history.

(56) References Cited

U.S. PATENT DOCUMENTS

| | | | |
|---|---|---|---|
| 5,679,975 A * | 10/1997 | Wyland et al. ................ 257/659 |
| 6,274,935 B2 | 8/2001 | Uzoh | |
| 6,321,976 B1 * | 11/2001 | Lo et al. ..................... 228/180.5 |
| 6,884,707 B1 * | 4/2005 | Cherian ....................... 438/611 |
| 6,924,554 B2 | 8/2005 | Gleixner et al. | |
| 7,009,305 B2 | 3/2006 | Carberry | |
| 7,049,217 B2 | 5/2006 | Ishikawa et al. | |
| 7,056,766 B2 | 6/2006 | Shiu et al. | |
| 7,404,513 B2 | 7/2008 | Kadoguchi et al. | |
| 7,417,324 B2 | 8/2008 | Obiya | |
| 2003/0141567 A1 * | 7/2003 | Akram ......................... 257/503 |
| 2005/0073038 A1 * | 4/2005 | Kuo et al. .................... 257/690 |
| 2005/0082347 A1 * | 4/2005 | Fitzsimmons et al. ..... 228/180.5 |
| 2005/0212128 A1 * | 9/2005 | Akram ......................... 257/735 |
| 2007/0018338 A1 * | 1/2007 | Hosseini et al. ............. 257/784 |
| 2007/0205520 A1 | 9/2007 | Chou et al. | |
| 2008/0054441 A1 | 3/2008 | Lin | |
| 2008/0272487 A1 | 11/2008 | Shim et al. | |
| 2009/0146269 A1 * | 6/2009 | Chow et al. .................. 257/659 |

\* cited by examiner

*Primary Examiner* — Charles Garber
*Assistant Examiner* — Andre' C Stevenson
(74) *Attorney, Agent, or Firm* — Ishimaru & Associates LLP

(57) ABSTRACT

A method of manufacture of an integrated circuit packaging system includes: providing a die paddle and a lead adjacent to the die paddle; mounting an integrated circuit, having a bond pad, over the die paddle; forming a bonding interconnect on the bond pad; attaching a circuit end of an internal interconnect to the bonding interconnect, the bonding interconnect between the circuit end and the bond pad; and connecting a lead end of the internal interconnect to the lead.

20 Claims, 3 Drawing Sheets

INTEGRATED CIRCUIT PACKAGING SYSTEM WITH INTERCONNECTS AND METHOD OF MANUFACTURE THEREOF

TECHNICAL FIELD

The present invention relates generally to an integrated circuit packaging system, and more particularly to a system for an integrated circuit packaging system having interconnects.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made using the semiconductor package structures. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor (or "chip") packages are of the type where a semiconductor die is molded into a package with a resin, such as an epoxy molding compound. Numerous package approaches stack multiple integrated circuit dice or package in package (PIP) or a combination. Other approaches include package level stacking or package-on-package (POP). POP designs face reliability challenges and higher cost.

Thus, a need still remains for an integrated circuit system improved yield, low profile, and improved reliability. In view of the ever-increasing commercial competitive pressures, along with growing consumer expectations and the diminishing opportunities for meaningful product differentiation in the marketplace, it is increasingly critical that answers be found for these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a die paddle and a lead adjacent to the die paddle; mounting an integrated circuit, having a bond pad, over the die paddle; forming a bonding interconnect on the bond pad; attaching a circuit end of an internal interconnect to the bonding interconnect, the bonding interconnect between the circuit end and the bond pad; and connecting a lead end of the internal interconnect to the lead.

The present invention provides an integrated circuit packaging system, including: a die paddle; a lead adjacent to the die paddle; an integrated circuit, having a bond pad, mounted over the die paddle; a bonding interconnect on the bond pad; and a circuit end of an internal interconnect attached to the bonding interconnect and a lead end of the internal interconnect connected to the lead, the bonding interconnect between the circuit end and the bonding pad.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
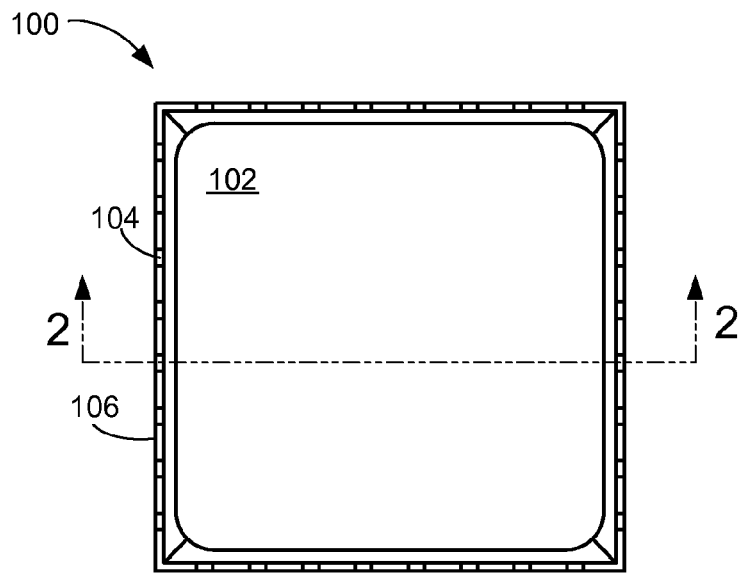
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements or components with no intervening material.

The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. The top view depicts an encapsulation 102, which is a cover, such as a protective covering. As an example, the encapsulation 102 can be formed by molding an encapsulation material such as epoxy molding compound or ceramic material.

Leads 104 can be exposed from the encapsulation 102. The leads 104 are conductive connectors for electrically connection to other devices or structures. The leads 104 can be made from conductive materials, such as copper, a copper based alloy, other metallic alloys, or other conductive materials. The leads 104 can be exposed along an encapsulation perimeter 106 of the encapsulation 102.

For illustrative purposes, the integrated circuit packaging system 100 is shown with the encapsulation 102 having a square geometric configuration, although it is understood that the encapsulation 102 can have a different geometric configuration. For example, the integrated circuit package system 100 can have the encapsulation 102 with a rectangular geometric configuration.

Figure 2:
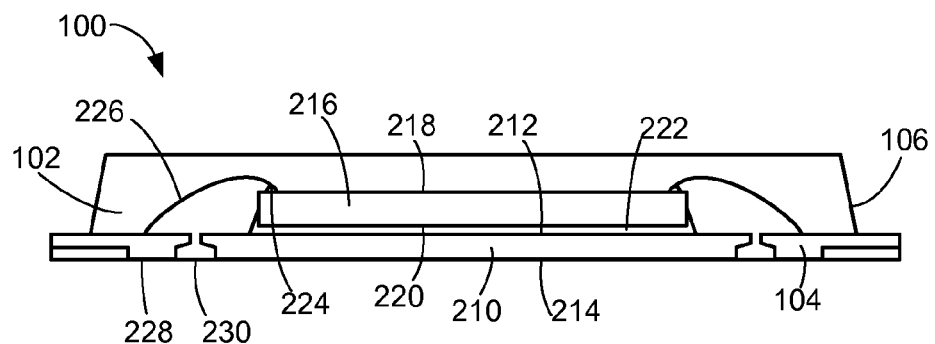
FIG. 2 is a cross sectional view of the integrated circuit packaging system along line 2-2 of FIG. 1.

Referring to FIG. 2, therein is shown a cross sectional view of the integrated circuit packaging system 100 along line 2-2 of FIG. 1. The cross-sectional view depicts the leads 104 adjacent to a die paddle 210. The die paddle 210 is a structure for mounting a device, such as an integrated circuit device. As an example, the die paddle 210 can be a die attach paddle, a heat sink, or a combination thereof. The die paddle 210 can be made from a number of materials, including conductive materials, such as copper, a copper based alloy, other metallic alloys, or other conductive materials. The die paddle 210 can have a paddle first side 212 and a paddle second side 214.

An integrated circuit 216 can be mounted over the paddle first side 212. The integrated circuit 216 is a semiconductor device having active circuitry fabricated thereto (not shown). As an example, the integrated circuit 216 can be an integrated circuit die, a thin integrated circuit die, an ultrathin integrated circuit die, or a wire-bonded integrated circuit die.

The integrated circuit 216 can have an active side 218 and a non-active side 220. The active side 218 is the side of the integrated circuit 216 having the active circuitry fabricated thereto. The active side 218 can face away from the paddle first side 212. The non-active side 220 can be the side of the integrated circuit 216 facing the paddle first side 212.

An adhesive 222 can be over the paddle first side 212. The integrated circuit 216 can be over the adhesive 222. The adhesive 222 is an adhesive material for bonding components. As an example, the adhesive 222 can be a thermally conductive adhesive material, a polymer based adhesive material, or any other adhesive material suitable for bonding components.

Bonding interconnects 224 can be over the active side 218 of the integrated circuit 216. The bonding interconnects 224 is a deformable conductive material for providing connection between a circuit device and another interconnect structure. As an example, the bonding interconnects 224 can be made from conductive material that is malleable, such as a tin, lead, an alloy made from tin and lead, silver or a silver alloy, or other alloys. As a further example, the bonding interconnects 224 can be made from a material that has a eutectic composition, meaning that the alloy has a composition which has a single melting and solidification temperature.

Internal interconnects 226 can connect the integrated circuit 216 and the leads 104. The internal interconnects 226 are conductive interconnects for electrical interconnection of devices and structures. As an example, the internal interconnects 226 can be bond wires or ribbon bond wires. As a further example, the internal interconnects 226 can be made from a conductive material, such as copper, brass, silver, aluminum, nickel, alloys composed of copper, brass, silver, aluminum, nickel, or other conductive alloy. The internal interconnects 226 can be connected to the integrated circuit 216 with the bonding interconnects 224, which will be discussed in further detail below.

The encapsulation 102 can be over the die paddle 210 and the leads 104. As a specific example, the encapsulation 102 can be on the paddle first side 212 and on the leads 104. The encapsulation 102 covers the integrated circuit 216, the adhesive 222, the bonding interconnects 224, and the internal interconnects 226. The paddle second side 214 of the die paddle 210 can be exposed from and be co-planar with an encapsulation bottom side 230 of the encapsulation 102.

The leads 104 can be exposed from the encapsulation perimeter 106. A lead bottom side 228 can be exposed from and co-planar with the encapsulation bottom side 230.

Figure 3:
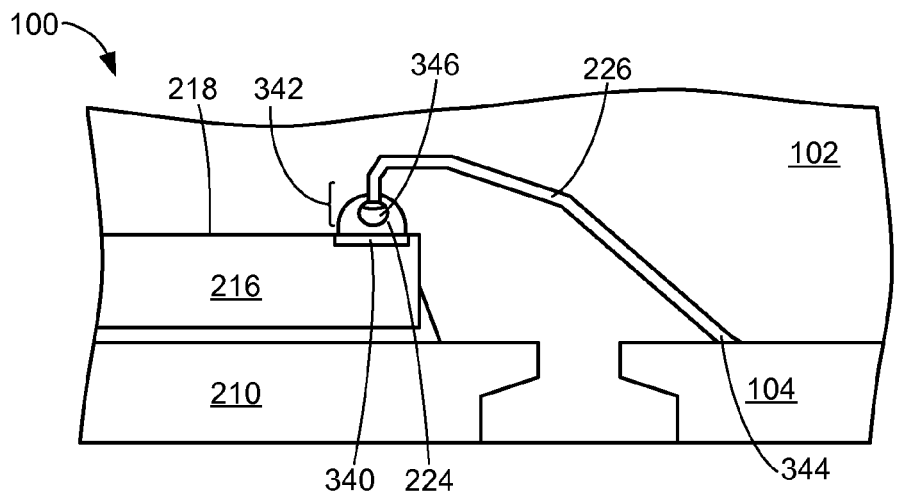
FIG. 3 is a detailed view of the integrated circuit packaging system of FIG. 1.

Referring to FIG. 3, therein is shown a detailed view of the integrated circuit packaging system 100 of FIG. 1. The detailed view depicts the integrated circuit 216 mounted over the die paddle 210. The leads 104 can be adjacent to the die paddle 210.

The integrated circuit 216 can have bond pads 340 along the active side 218 of the integrated circuit 216. The bond pads 340 is a pad for receiving electrical connection from a source external to a circuit device. As an example, the bond pads 340 can be made from a conductive material, such as copper, a copper alloy, gold, a gold alloy, nickel, a nickel alloy, or other alloys. However, the bond pads 340 are preferably not made of aluminum. The bond pads 340 can be over the active circuitry.

The bonding interconnects 224 can be over and on the bond pads 340. As an example, the bonding interconnects 224 can be in direct contact with the bond pads 340. As a further example, the bonding interconnects 224 within horizontal bounds of the bond pads 340.

The internal interconnects 226 can have a circuit end 342 and a lead end 344. The circuit end 342 can be connected to the integrated circuit 216. The lead end 344 of the internal interconnects 226 can be connected to the leads 104.

The circuit end 342 can have an interconnect ball 346 at a tip of the circuit end 342. The interconnect ball 346 is a rounded or spherically shaped structure. As an example, the interconnect ball 346 can be formed from the same material as the internal interconnects 226. The circuit end 342 attaches to the bonding interconnects 224 with the bonding interconnects 224 between the circuit end 342 and the bonding pad 340.

The interconnect ball 346 can be embedded in the bonding interconnects 224. As an example, the bonding interconnects 224 can completely surround and be in direct contact with the interconnect ball 346. As a further example, the bonding interconnects 224 can surround a portion of the circuit end 342 adjacent to the interconnect ball 346. In yet another example, the interconnect ball 346 can be partially embedded in the bonding interconnects 224 with a portion of the interconnect ball 346, a portion of the circuit end 342, or a combination there of exposed from the bonding interconnects 224.

For illustrative purposes, the integrated circuit packaging system 100 is shown with the interconnect ball 346 embedded in the bonding interconnects 224 and over the bond pads 340 without directly contacting the bond pads 340, although it is understood that the interconnect ball 346 can be embedded in the bonding interconnects 224 differently. For example, the interconnect ball 346 can be suspended over the bond pads 340 with a portion of the interconnect ball 346 in direct contact with the bond pads 340.

It has been discovered that the present invention provides the integrated circuit packaging system 100 having improved connectivity between the internal interconnects 226 and the bond pads 340. The internal interconnects 226 embedded in the bonding interconnects 224 forms a robust intermetallic bond between the internal interconnects 226 and the bond pads 340 regardless of any oxidation that may be on the internal interconnects 226, thereby providing improving electrical connectivity between the bond pads 340 and the internal interconnects 226. In addition, connecting the internal interconnects 226 to the bond pads 340 with the bonding interconnects 224 eliminates the need for forming gasses required for wire bonding processes, particularly when forming bonds with copper wires, thus reducing overall processing and manufacturing cost for the integrated circuit packaging system 100.

It has also been discovered that the present invention provides the integrated circuit packaging system 100 having improved reliability and increased yield. The bonding interconnects 224 provides a physical buffer or cushion which reduces the force required when bonding the internal interconnects 226 with the bond pads 340. The reduced force applied during bonding prevents damage to sensitive circuits and devices having a low dielectric constant "k" (low-k devices), thus improving the reliability and yield for the integrated circuit packaging system 100.

Figure 4:
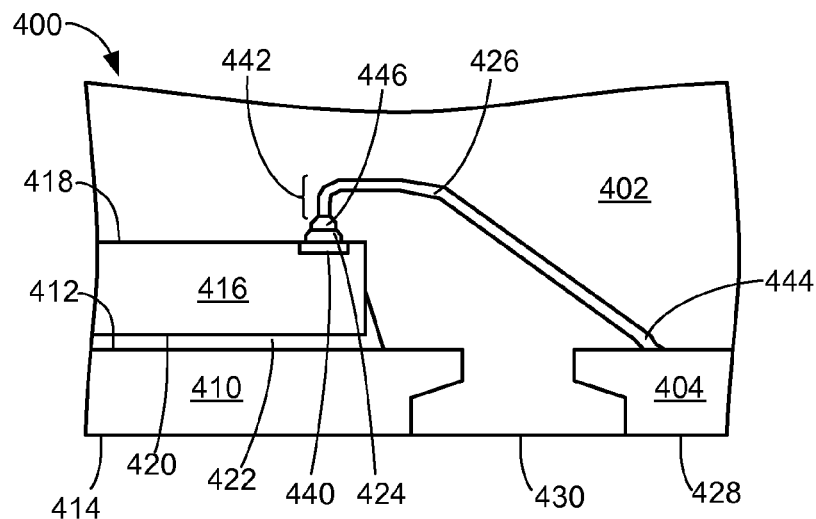
FIG. 4 is a detailed cross-sectional view of an integrated circuit packaging system as exemplified by the top view of FIG. 1 along line 2-2 of FIG. 1 in a second embodiment of the present invention.

Referring now to FIG. 4 therein is shown a detailed cross-sectional view of an integrated circuit packaging system 400 as exemplified by the top view of FIG. 1 along line 2-2 of FIG. 1 in a second embodiment of the present invention. The detailed cross-sectional view depicts a leads 404 adjacent to a die paddle 410. The leads 404 are conductive connectors for electrically connection to other devices or structures. The leads 404 can be made from conductive materials, such as copper, a copper based alloy, other metallic alloys, or other conductive materials.

The die paddle 410 is a structure for mounting a device, such as an integrated circuit device. As an example, the die paddle 410 can be a die attach paddle, a heat sink, or a combination thereof. The die paddle 410 can be made from a number of materials, including conductive materials, such as copper, a copper based alloy, other metallic alloys, or other conductive materials. The die paddle 410 can have a paddle first side 412 and a paddle second side 414.

An integrated circuit 416 can be mounted over the paddle first side 412. The integrated circuit 416 is a semiconductor device having active circuitry fabricated thereto (not shown). As an example, the integrated circuit 416 can be an integrated circuit die, a thin integrated circuit die, an ultrathin integrated circuit die, or a wire-bonded integrated circuit die.

The integrated circuit 416 can have an active side 418 and a non-active side 420. The active side 418 is the side of the integrated circuit 416 having the active circuitry fabricated thereto. The active side 418 can face away from the paddle first side 412. The non-active side 420 can be the side of the integrated circuit 416 facing the paddle first side 412.

The integrated circuit 416 can have bond pads 440 along the active side 418 of the integrated circuit 416. The bond pads 440 are a pad for receiving electrical connection from a source external to a circuit device. As an example, the bond pads 440 can be made from a conductive material, such as copper, a copper alloy, gold, a gold alloy, nickel, a nickel alloy, or other alloys. However, the bond pads 440 are preferably not made of aluminum.

An adhesive 422 can be over the paddle first side 412. The integrated circuit 416 can be over the adhesive 422. The adhesive 422 is an adhesive material for bonding components. As an example, the adhesive 422 can be a thermally conductive adhesive material, a polymer based adhesive material, or any other adhesive material suitable for bonding components.

Bonding interconnects 424 can be over the active side 418 of the integrated circuit 416. The bonding interconnects 424 is a deformable conductive material for providing connection between a circuit device and another interconnect structure. As an example, the bonding interconnects 424 can be made from conductive material that is malleable, such as gold, a gold alloy, or other alloys. As a further example, the bonding interconnects 424 can be made from a material that has a eutectic composition, meaning that the alloy has a composition which has a single melting and solidification temperature.

The bonding interconnects 424 can be over and on the bond pads 440. As an example, the bonding interconnects 424 can be in direct contact with the bond pads 440. As a further example, the bonding interconnects 424 within horizontal bounds of the bond pads 440.

Internal interconnects 426 can connect the integrated circuit 416 and the leads 404. The internal interconnects 426 are conductive interconnects for electrical interconnection of devices and structures. As an example, the internal interconnects 426 can be bond wires or ribbon bond wires. As a further example, the internal interconnects 426 can be made from a conductive material, such as silver, a silver alloy, or other conductive alloys.

The internal interconnects 426 can have a circuit end 442 and a lead end 444. The circuit end 442 can be connected to the integrated circuit 416. The lead end 444 of the internal interconnects 426 can be connected to the leads 404.

The circuit end 442 can have an interconnect ball 446 at a tip of the circuit end 442. The interconnect ball 446 is a rounded structure. As an example, the interconnect ball 446 can be formed from the same material as the internal interconnects 426.

The interconnect ball 446 can be bonded on the bonding interconnects 424. The interconnect ball 446 can have a horizontal dimension that is smaller than the bonding interconnects 424. The interconnect ball 446 can be pressed on the bonding interconnects 424 with the bonding interconnects 424 maintaining a semi-circular shape after bonding.

The integrated circuit packaging system 400 can include an encapsulation 402, which is a cover, such as a protective covering. As an example, the encapsulation 402 can be formed by molding an encapsulation material such as epoxy molding compound or ceramic material.

The encapsulation 402 can be over the die paddle 410 and the leads 404. The encapsulation can cover the integrated circuit 416, the adhesive 422, the bonding interconnects 424, and the internal interconnects 426. The paddle second side 414 of the die paddle 410 can be exposed from and be co-planar with an encapsulation bottom side 430. A lead bottom side 428 can be exposed from and co-planar with the encapsulation bottom side 430 of the encapsulation 402.

It has been found that the present invention provides the integrated circuit packaging system 400 having improved reliability. The bonding interconnects 424 made from gold or a gold alloy provides a malleable material that is less likely to break the bond pads 440 than bonding directly to the bond pad 424 with only the internal interconnect 426 made from silver or a silver alloy.

It has also been found that the present invention provides the integrated circuit packaging system 400 having improved connectivity. The bonding interconnects 424 made from gold or gold alloy provides improved intermetallic bond formation between the bond pads 440 and internal interconnect 426 made from silver or a silver alloy, thus providing improved electrical connectivity.

Figure 5:
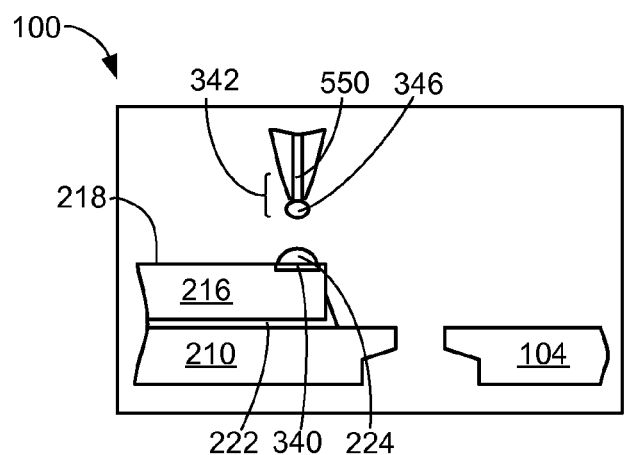
FIG. 5 is a portion of the integrated circuit packaging system of FIG. 1 in a forming phase.

Referring now to FIG. 5, therein is shown a portion of the integrated circuit packaging system 100 of FIG. 1 in a forming phase. The forming phase depicts the integrated circuit 216 mounted over the die paddle 210 with the adhesive 222. The leads can be formed adjacent to the die paddle 210.

The bond pads 340 can be formed over active circuitry along the active side 218 of the integrated circuit 216. The bonding interconnects 224 can be formed over the bond pads 340 prior to mounting the integrated circuit 216 over the die paddle 210. The bonding interconnects 224 formed over the bond pads 340 prior to mounting of the integrated circuit 216 can also be referred to as pre-formed deformable bonding interconnects attached on to the bond pads 340.

A connector 550 can be embedded into the bonding interconnects 224 after previously forming the bonding interconnects 224. The connector 550 can be the precursor to the internal interconnects 226 of FIG. 2. The connector 550 can have the interconnect ball 346 and the circuit end 342. The interconnect ball 346 can be partially embedded into the bonding interconnects 224.

The connector 550 can be embedded into the bonding interconnects 224 in a number of different ways. For example, a wire bonding machine can embed the interconnect ball 346 and a portion of the circuit end 342 of the connector 550 into the bonding interconnects 224 through a thermosonically or compressively. Furthermore, the use of forming gasses to prevent oxidation of the interconnect ball 346 and other portions of the connector 550 is not required. As a specific example, the connector 550 can be embedded into the bonding interconnects 224 at a temperature of approximately 190 degrees Celsius for the bonding interconnects 224 made from tin, although it is understood that other temperatures can be used for the bonding interconnects 224 made from other materials.

Figure 6:
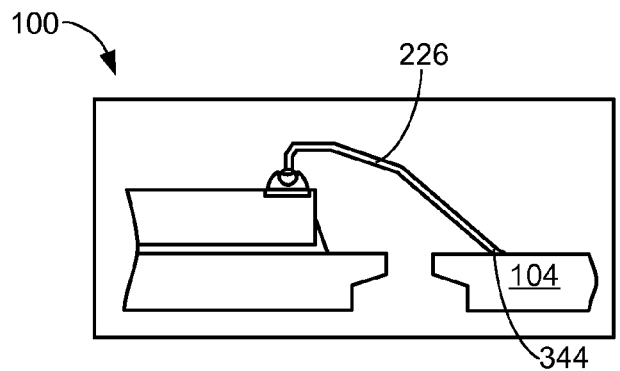
FIG. 6 is the structure of FIG. 5 in forming the internal interconnects.

Referring now to FIG. 6 therein is shown the structure of FIG. 5 in forming the internal interconnects 226. The connector 550 of FIG. 5 can be connected to the leads 104 at the lead end 344 to form the internal interconnects 226.

The connector 550 can be connected to the leads 104 in a number of different ways. For example, the connector 550 can be connected to the leads 104 through known methods such as wire bond stitching.

Figure 7:
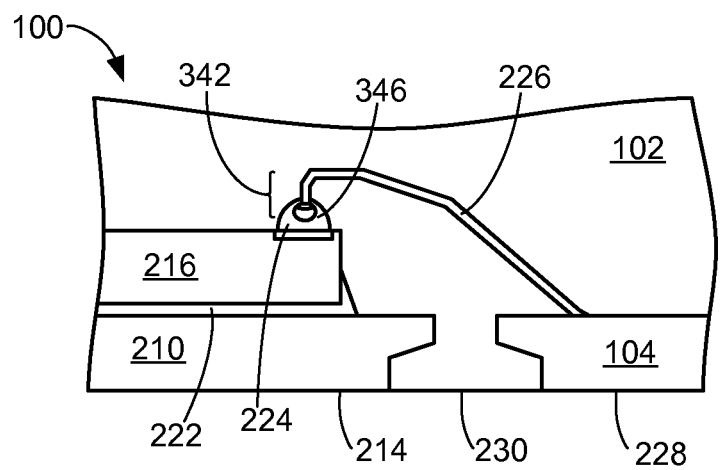
FIG. 7 is the structure of FIG. 6 in forming the integrated circuit packaging system.

Referring now to FIG. 7 therein is shown the structure of FIG. 6 in forming the integrated circuit packaging system 100. The bonding interconnects 224 can be formed to surround the interconnect ball 346 and a portion of the circuit end 342. As an example, the bonding interconnects 224 can be formed to completely surround and be in direct contact with the interconnect ball 346. As a further example, the bonding interconnects 224 can surround a portion of the circuit end 342 adjacent to the interconnect ball 346. In yet another example, the interconnect ball 346 can be partially embedded in the bonding interconnects 224 with a portion of the interconnect ball 346, a portion of the circuit end 342, or a combination there of exposed from the bonding interconnects 224.

The bonding interconnects 224 can processed to surround the interconnect ball 346 in a number of different ways. For example, the bonding interconnects 224 can undergo a reflow process. As a specific example, the reflow process can be a separate convection reflow process which is performed after the connector 550 of FIG. 5 is embedded in the bonding interconnects 224. As an alternate example, the reflow process can be performed through conduction using wirebond heating blocks (not shown) as a post heating process following embedding of the connector 550 into the bonding interconnects 224. As a further specific example, the reflow process temperature of approximately 210 degrees Celsius for the bonding interconnects 224 made from tin, although it is understood that other temperatures can be used for the bonding interconnects 224 made from other materials.

The encapsulation 102 can be formed over the die paddle 210 and the leads 104. The encapsulation 102 can be formed to cover the integrated circuit 216, the adhesive 222, the bonding interconnects 224, and the internal interconnects 226.

The encapsulation 102 can be formed to have the encapsulation bottom side 230. The paddle second side 214 of the die paddle 210 can be exposed from and be co-planar with the encapsulation bottom side 230. The lead bottom side 228 can be exposed from and co-planar with the encapsulation bottom side 230.

Figure 8:
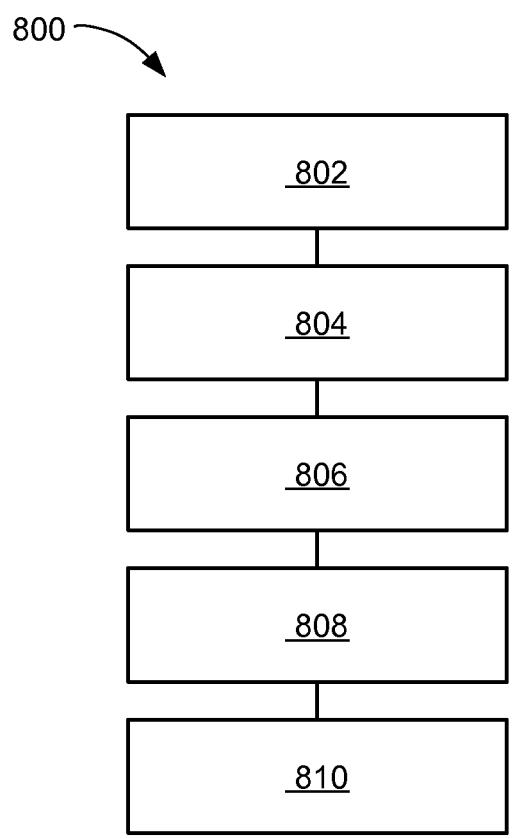
FIG. 8 is a flow chart of a method of manufacture of an integrated circuit packaging system in a further embodiment of the present invention.

Referring now to FIG. 8, therein is shown a flow chart of a method 800 of manufacture of an integrated circuit packaging system 100 in a further embodiment of the present invention. The method 800 includes: providing a die paddle and a lead adjacent to the die paddle in a block 802; mounting an integrated circuit, having a bond pad, over the die paddle in a block 804; forming a bonding interconnect on the bond pad in a block 806; embedding a circuit end of an internal interconnect in the bonding interconnect in a block 808; and connecting a lead end of the internal interconnect to the lead in a block 810.

Thus, it has been discovered that the integrated circuit packaging system of the present invention furnishes important and heretofore unknown and unavailable solutions, capabilities, and functional aspects for interconnects. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
providing a die paddle and a lead adjacent to the die paddle;
mounting an integrated circuit having a pre-formed deformable bonding interconnect on a bond pad, over the die paddle;
forming an interconnect ball having a spherical shape at the tip of a circuit end of an internal interconnect with the interconnect ball formed from the same material as the internal interconnect;
attaching by embedding the interconnect ball and at least a portion of a circuit end of an internal interconnect in the pre-formed deformable bonding interconnect, the pre-formed deformable bonding interconnect in direct contact with and completely surrounding the interconnect ball, the circuit end providing electrical connectivity between the bond pad and the internal interconnect regardless of any oxidation on the circuit end by a wire bonding process free of forming gasses, and the pre-formed deformable bonding interconnect between the circuit end and the bond pad; and
connecting a lead end of the internal interconnect to the lead.

2. The method as claimed in claim 1 wherein attaching the circuit end includes embedding the circuit end having the interconnect ball within the pre-formed deformable bonding interconnect and without contact with the bond pad.

3. The method as claimed in claim 1 wherein mounting the integrated circuit includes mounting the integrated circuit having active circuitry and the bond pad over the active circuitry.

4. The method as claimed in claim 1 further comprising forming an encapsulation over the integrated circuit, the pre-formed deformable bonding interconnect, and the internal interconnect.

5. The method as claimed in claim 1 wherein mounting the integrated circuit having the pre-formed deformable bonding interconnect includes mounting the integrated circuit having the pre-formed deformable bonding interconnect within horizontal bounds of the bond pad.

6. A method of manufacture of an integrated circuit packaging system comprising:
providing a die paddle and a lead adjacent to the die paddle;
mounting an integrated circuit having a pre-formed deformable bonding on a bond pad along an active side of the integrated circuit, over the die paddle;
forming interconnect ball having a spherical she at the tip of a circuit end of an internal interconnect with the interconnect ball formed from the same material as the internal interconnect;
attaching by embedding the interconnect ball and at least a portion of a circuit end of an internal interconnect in the pre-formed deformable bonding interconnect previously formed, the pre-formed deformable bonding interconnect in direct contact with and completely surrounding the interconnect ball, the circuit end providing electrical connectivity between the bond pad and the internal interconnect regardless of any oxidation on the circuit end by a wire bonding process free of forming gasses, and the pre-formed deformable bonding interconnect between the circuit end and the bond pad; and
connecting a lead end of the internal interconnect to the lead.

7. The method as claimed in claim 6 wherein attaching the circuit end includes embedding the circuit end having the interconnect ball within the pre-formed deformable bonding interconnect and in direct contact with the bond pad.

8. The method as claimed in claim 6 wherein attaching the circuit end includes embedding the internal interconnect in the pre-formed deformable bonding interconnect for forming an intermetallic bond with the bond pad to improve connectivity.

9. The method as claimed in claim 6 wherein mounting the integrated circuit having the pre-formed deformable bonding interconnect includes mounting the integrated circuit having the bonding interconnect from solder.

10. The method as claimed in claim 6 further comprising:
forming an adhesive over the die paddle; and
wherein:
mounting the integrated circuit includes mounting the integrated circuit over the adhesive.

11. An integrated circuit packaging system comprising:
a die paddle;
a lead adjacent to the die paddle;
an integrated circuit having a pre-formed deformable bonding interconnect on a bond pad, mounted over the die paddle;
a circuit end of an internal interconnect;
a interconnect ball having a spherical shape at the tip of the circuit end of the internal interconnect with the interconnect ball formed from the same material as the internal interconnect;
at least a portion of a circuit end of an internal interconnect embedded in the pre-formed deformable conductive material of the bonding interconnect, the pre-formed deformable bonding interconnect in direct contact with and completely surrounding the interconnect ball, the circuit end providing electrical connectivity between the bond pad and the internal interconnect regardless of any oxidation on the circuit end, and a lead end of the internal interconnect connected to the lead, the bonding interconnect between the circuit end and the bonding pad.

12. The system as claimed in claim 11 wherein the circuit end includes the interconnect ball embedded within the pre-formed deformable bonding interconnect and without contact with the bond pad.

13. The system as claimed in claim 11 wherein the bond pad is over active circuitry of the integrated circuit.

14. The system as claimed in claim 11 further comprising an encapsulation over the integrated circuit, the pre-formed deformable bonding interconnect, and the internal interconnect.

15. The system as claimed in claim 11 wherein the pre-formed deformable bonding interconnect is within horizontal bounds of the bond pad.

16. The system as claimed in claim 11 wherein the bond pad is along an active side of the integrated circuit.

17. The system as claimed in claim 16 wherein the circuit end includes an interconnect ball embedded in the pre-formed deformable bonding interconnect in direct contact with the bond pad.

18. The system as claimed in claim 16 wherein the internal interconnect is embedded in the pre-formed deformable bonding interconnect for forming an intermetallic bond with the bond pad to improve connectivity.

19. The system as claimed in claim 16 wherein the pre-formed deformable bonding interconnect is made from solder.

20. The system as claimed in claim 16 further comprising an adhesive over the die paddle and the integrated circuit over the adhesive.

* * * * *

UNITED STATES PATENT AND TRADEMARK OFFICE
CERTIFICATE OF CORRECTION

PATENT NO. : 8,802,555 B2
APPLICATION NO. : 13/069980
DATED : August 12, 2014
INVENTOR(S) : Bathan et al.

Page 1 of 1

It is certified that error appears in the above-identified patent and that said Letters Patent is hereby corrected as shown below:

In the Claims:

1. Column 9, Claim 6, line 64, delete "forming interconnect ball having a spherical she" and insert therefor --forming an interconnect ball having a spherical shape--

2. Column 10, Claim 11, line 39, delete "a interconnect" and insert therefor --an interconnect--

Signed and Sealed this
Tenth Day of May, 2016

Michelle K. Lee
*Director of the United States Patent and Trademark Office*